United States Patent [19]

Braun et al.

[11] 4,377,854
[45] Mar. 22, 1983

[54] SUBSTRATE FOR MAGNETIC DOMAIN DEVICE

[75] Inventors: Roland J. Braun, Vestal; Gary R. Carden, Endwell; Keith A. Snyder, Vestal, all of N.Y.

[73] Assignee: International Business Machines Corporation, Armonk, N.Y.

[21] Appl. No.: 170,303

[22] Filed: Jul. 18, 1980

Related U.S. Application Data

[63] Continuation of Ser. No. 51,926, Jun. 25, 1979, abandoned.

[51] Int. Cl.³ .................... G11C 5/04; G11C 19/08
[52] U.S. Cl. ........................................ 365/2; 365/27
[58] Field of Search ............................. 365/2, 27, 28

[56] References Cited

U.S. PATENT DOCUMENTS

| 4,027,298 | 5/1977 | Michaelis ................. 365/2 |
| 4,209,848 | 6/1980 | Braun et al. ............... 365/2 |

FOREIGN PATENT DOCUMENTS 54-156438 12/1979 Japan ..................................... 365/2

OTHER PUBLICATIONS

IBM Technical Disclosure Bulletin-vol. 18, No. 10, Mar. 1976, pp. 3184-3185.
IBM Technical Disclosure Bulletin-vol. 15, No. 5, Oct. 1972, p. 1602.

*Primary Examiner*—James W. Moffitt
*Attorney, Agent, or Firm*—Norman R. Bardales

[57] ABSTRACT

In a field-accessed magnetic domain device package assembly, the magnetic domain device carrier or support, the circuit line or conductor carrier, and the magnetic bias field source are integrally and coactively provided by a common substrate member. The member is a planar permanent magnetic insulator ceramic and carries a bonded conductor or wiring pattern. The input/output (I/O) terminals of the domain device, also referred to in the art as a chip, are selectively bonded to the conductors of the pattern thereby providing mechanical support of the chip directly to the substrate in a superimposed relationship, input/output electrical connection to the chip, and mounting of the chip in close proximity to the bias field source, the flux of which passes through the superimposed mounted chips to a high permeability member at least part of which is disposed on the opposite side of the chip.

11 Claims, 10 Drawing Figures

SUBSTRATE FOR MAGNETIC DOMAIN DEVICE

This is a continuation of the application, Ser. No. 051,926, filed June 25, 1979, now abandoned.

BACKGROUND OF THE INVENTION

1. Field of the Invention

This invention relates to magnetic domain device apparatus and, more particularly, to improvements for packaging such apparatus.

2. Description of the Prior Art

The present invention provides an improvement to magnetic domain device apparatus such as, for example, the type disclosed in the publication entitled "Magnetic Bubble Module—Double Density", W. A. Lyons and A. A. Rifkin, IBM Technical Disclosure Bulletin, Vol. 15, No. 5, October 1972, page 1602.

The pluggable package disclosed in the aforementioned publication has a planar single magnetic plate which provides the bias field. Magnetic domain, also referred to as a bubble in the art, chips are mounted to the conductors of a single-sided conductor insulator carrier, i.e. Mylar (registered trademark of E. I. DuPont de Nemours & Co.). The chip-carrier assembly is in turn mounted to the magnetic plate by back bonding the carrier to the surface of the plate, there being a similar assembly also affixed to the opposite surface of the plate in the same manner. The entire assembly of chips, insulator carriers and magnetic plate is sandwiched between two parallel I/O plates and within a spacer structure which separates the two I/O plates and supports the magnetic plate. The conductors of each carrier are connected to the respective I/O plate that is located on the same side of the magnetic plate as is the particular carrier. The I/O pins of the package, which are normal to the I/O plates, are carried by the spacer structure and are interconnected to the conductors of the carriers via their respective I/O plates.

The package of the aforementioned publication has several disadvantages. For example, its mechanical and electrical connection reliability is impaired because of the number and complexity of interconnection interfaces required and/or different thermal characteristics at each interface. In particular, the interconnection interface between the chip terminals and the conductors of the Mylar carrier and the underlying interconnection interface between the Mylar carrier and the magnetic plate are subject to failure due to mechanical stresses caused by thermal cycling effects and the like. In addition, the bias field provided by the single magnetic plate requires critical centering of the chips with respect thereto because of the field distortion associated with the edges of the magnetic plate and the like, thus limiting the number of chips that can be mounted for a given area size magnetic plate.

In U.S. Pat. No. 3,864,671 there is disclosed another type of magnetic domain device package. It uses a permanent magnet ring or framelike structure for biasing the domain devices. As is well known to those skilled in the art, the framelike magnet provides a magnetic field within the opening, and it is essential that the domain device lie within the opening formed in the framelike structure and be in substantial coplanar relationship therewith. Thus, in such type packages a separate non-magnetic substrate member is required to support the domain device and at least some of the conductors associated therewith. Thus, in the particular package disclosed in the aforementioned patent the framelike permanent magnet ceramic does not directly support the magnet domain device. Furthermore, such prior art packages of the type described, for example, in the aforementioned patent, are subject to poor mechanical and electrical connection reliability due to the number and complexity of the interconnection interfaces required and/or different thermal characteristics at each interface.

It is well known that the bias field for a magnetic domain device has to be held within a relatively controlled range. If the field strength is above the range, the bubbles collapse. If the field strength is below the range, on the other hand, the bubbles spread out and their control becomes unreliable. As is well known to those skilled in the art, both the domain device and magnetic bias field produced by the permanent magnet are temperature responsive. Because of the physical separation of the domain devices and the permanent magnet in the prior art structures, the two were subject to two different and varying temperatures. This adversely affected the thermal tracking characteristic between the two, i.e. the ability to maintain the temperature differential between the domain devices and the permanent magnet within some predetermined operating tolerance and hence within the aforementioned range. As a result of the aforementioned separation, the prior art structures were more susceptible to being inoperable because of the inability to stabilize the aforementioned temperature differential.

SUMMARY OF THE INVENTION

It is an object of this invention to provide field-accessed magnetic domain device package apparatus which is simple, has highly reliable electrical and/or mechanical interconnections, and/or mitigates the effects of thermal cycling, and/or has improved thermal tracking characteristics.

It is another object of this invention to provide magnetic domain device package apparatus of the aforementioned kind which reduces the complexity and number of components heretofore required in the prior art for supporting the domain devices, for supporting the input/output conductors, and for providing the bias field source.

According to one aspect of the invention, in field-accessed magnetic domain device package apparatus having plural input/output package terminals and a rotational magnetic field coil system associated therewith, there is provided magnetic ceramic first member means for providing a magnetic bias field source. Plural conductors are directly affixed to and supported by the first member means. At least one magnetic domain device having plural input/output device terminals is supported by the first member means in a predetermined superimposed relationship therewith by selectively bonding the input/output device terminals to the plural conductors. The plural conductors are further selectively coupled to the input/output package terminals. Magnetic circuit second member means coacts with the first member means to provide a magnetic bias field for the domain device.

The foregoing and other objects, features and advantages of the invention will be apparent from the following more particular description of preferred embodiments of the invention, as illustrated in the accompanying drawing.

BRIEF DESCRIPTION OF THE DRAWING

In the figures, like elements are designated with similar reference numbers.

DESCRIPTION OF THE PREFERRED EMBODIMENTS

Figure 1:
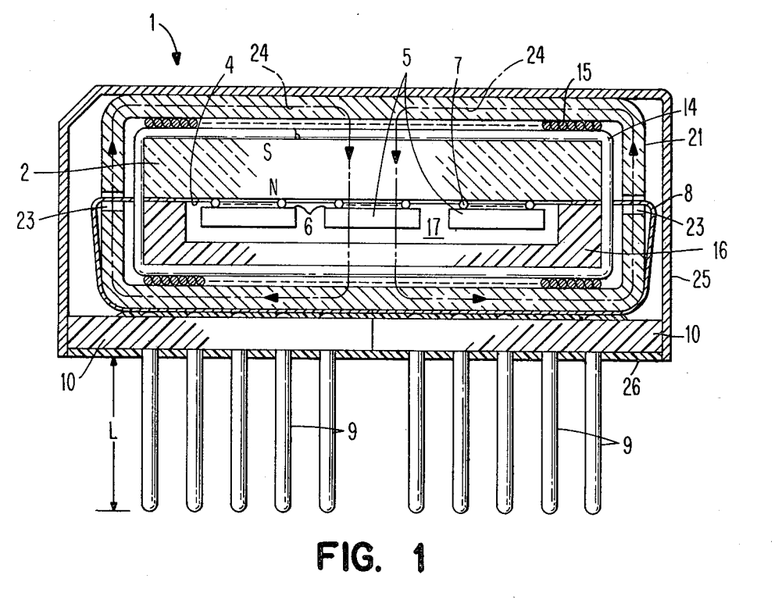
FIG. 1 is a cross-sectional view of a preferred embodiment of the field-accessed magnetic domain device package apparatus of the present invention.
Figure 2:
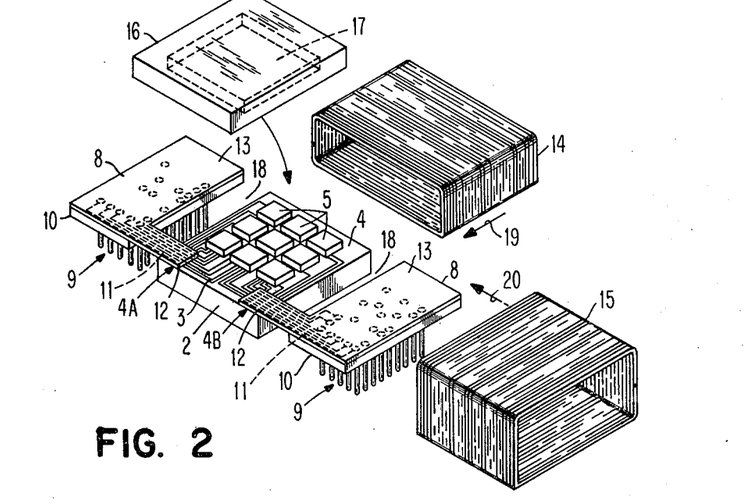
FIG. 2 is a perspective and exploded view of a partial assembly of the apparatus of FIG. 1.
Figure 3:
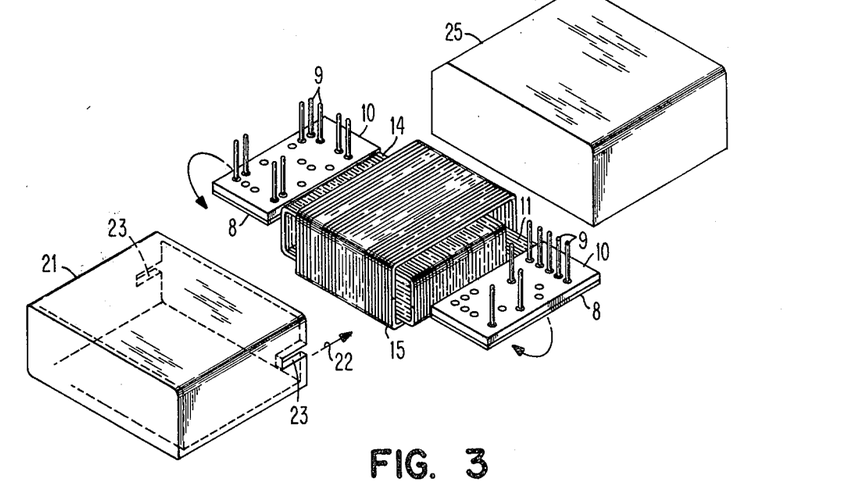
FIG. 3 is a perspective and exploded view of the apparatus of FIG. 1 with the rotational field coils assembled thereto.

Referring to FIGS. 1-3, in the field-accessed magnetic domain device package apparatus 1 thereof, member 2 is a planar insulator permanent magnet ceramic, e.g. a barium ferrite magnet. Member 2 preferably has a rectangular configuration. Plural conductors 3 are directly affixed to and supported by member 2 on its surface 4. For sake of clarity, only a few of the conductors 3 are schematically shown, cf. FIG. 2. The conductors 3 are disposed in a substantially parallel relationship at surface corners 4A, 4B of member 2 and from there fan out to the individual bubble domain device mounting sites on the member 2.

Preferably, one or more magnetic domain devices 5 are packaged in the apparatus. Thus, by way of example, apparatus 1 has nine such devices, i.e. chips, 5 arranged in a three-by-three array. More particularly, each chip 5 has a plurality of I/O device terminals, not shown for sake of clarity, on its surface 6, cf. FIG. 1. Member 2 supports the chips 5 in a superimposed relationship by selectively bonding the aforementioned I/O device terminals to conductors 3 at the respective aforementioned mounting sites of member 2. Preferably, the I/O device terminals are pads which are bonded to the particular conductors 3 by a controlled collapse chip connection process, referred to in the art as C-4, via reflow solder connectors 7, cf. FIG. 1.

In the embodiment of FIGS. 1-3, a pair of L-shaped single-sided flexible printed circuit conductor decals 8 are used to selectively couple the conductors 3 to the input/output package terminals 9. Preferably, apparatus 1 as configured as a pluggable type package and, hence, terminals 9 are conductive pins. Pins 9 are carried in insulator pin carrier members 10 and are arranged in a rectangular array. The pins 9 are extended from the members 10 a uniform length L. The heads of pins 9 also slightly protrude outwardly from members 10 in a uniform manner. The portions of the respective decal conductor patterns 11, only a few conductors of which are shown for sake of clarity, cf. FIG. 3, in the small leg or bridge segments 12 of decal 8 are compatibly configured and in alignment with the conductors 3 on the corners 4A, 4B of member 2. The conductor patterns 11 of decals 8 fan out from segment 12 onto the respective major segments 13 of decals 8. On segments 13 the conductors of patterns 11 are terminated as an array of bonding sites or pads which are in alignment with and bonded to the respective heads of the array of pins 9.

The rotational magnetic field coil system includes a pair of orthogonal preferably prewound insulated coils 14, 15 arbitrarily selected for sake of explanation as being the X and Y coils respectively. An insulator spacer member 16 having a cover-like configuration coacting with the member 2 encloses the chips 5 within the space 17 or recess of member 16 in a box-like manner. Inner coil 14 fits around and over the enclosure, i.e. members 2 and 16, by passing coil 14 between the spaces 18 in the direction shown by the arrow 19 in FIG. 2. Outer coil 15 is then passed in the orthogonal direction, cf. arrow 20, over the inner coil 15, the inside dimensions of the coil 15 and the members 8, 9 and 10 being judiciously selected to allow passage of the coil 15. Alternatively, coil 15 may be assembled over coil 14 prior to affixing a decal 8 to a pin carrier member 10, i.e., prior to the bonding of the conductors of pattern 11 of the decal 8 to the heads of the pins 9 of the carrier member 10. This allows the pins 9 to be larger than would otherwise be the case if the member 10 had to first pass through the coil 15. As a result, the coils 14, 15 are now assembled, as shown in FIG. 3.

A magnetic circuit member 21 having a hollow- or sleevelike configuration is next slipped over the outer coil 15 by passing it through the spaces 18 in the direction of arrow 22, as shown in FIG. 3. Slits 23 are provided in the leading side edges of the member 21 to accommodate therebetween the bridge segments 12 of the decals 8. Member 21 is a high permeability member and in coaction with the member 2 provides a magnetic bias field for the domain devices 5. To this end, assuming by way of example, the magnetic polarization of the magnetic member 2 shown in FIG. 1, the flux emanates from the magnetic member 2 out of surface 4 to the portion of the member 21 located on the opposite sides of the chips 5 and is then returned by member 21 to the opposite surface of magnetic member 2, cf. flux lines 24. As is readily apparent to those skilled in the art, the bias field between members 2 and 21 has a greater effective area and/or more uniform distribution than is the case for prior art structures using fields provided by ring-like permanent magnet members or just a single magnetic plate such as the ones described in the aforementioned prior art patent and publication, respectively.

The flexible bridge segments 12 permit the pin carrier members 10 to be folded under the member 21, cf. FIG. 1, and the entire assembly is enclosed by an electrical shield or cover 25 of a suitable material such as aluminum or the like. The apparatus 1 is then hermetically sealed by a suitable conventional sealant 26 such as a potting epoxy or the like.

Figure 4:
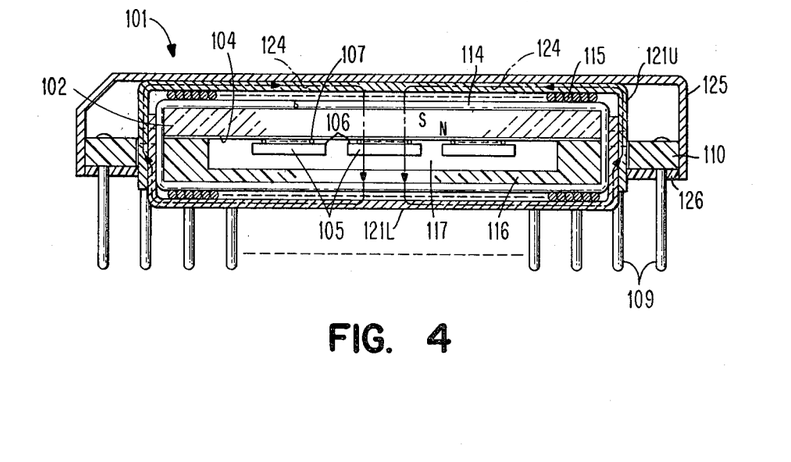
FIG. 4 is a cross-sectional view of another preferred embodiment of the apparatus of the present invention.
Figure 5:
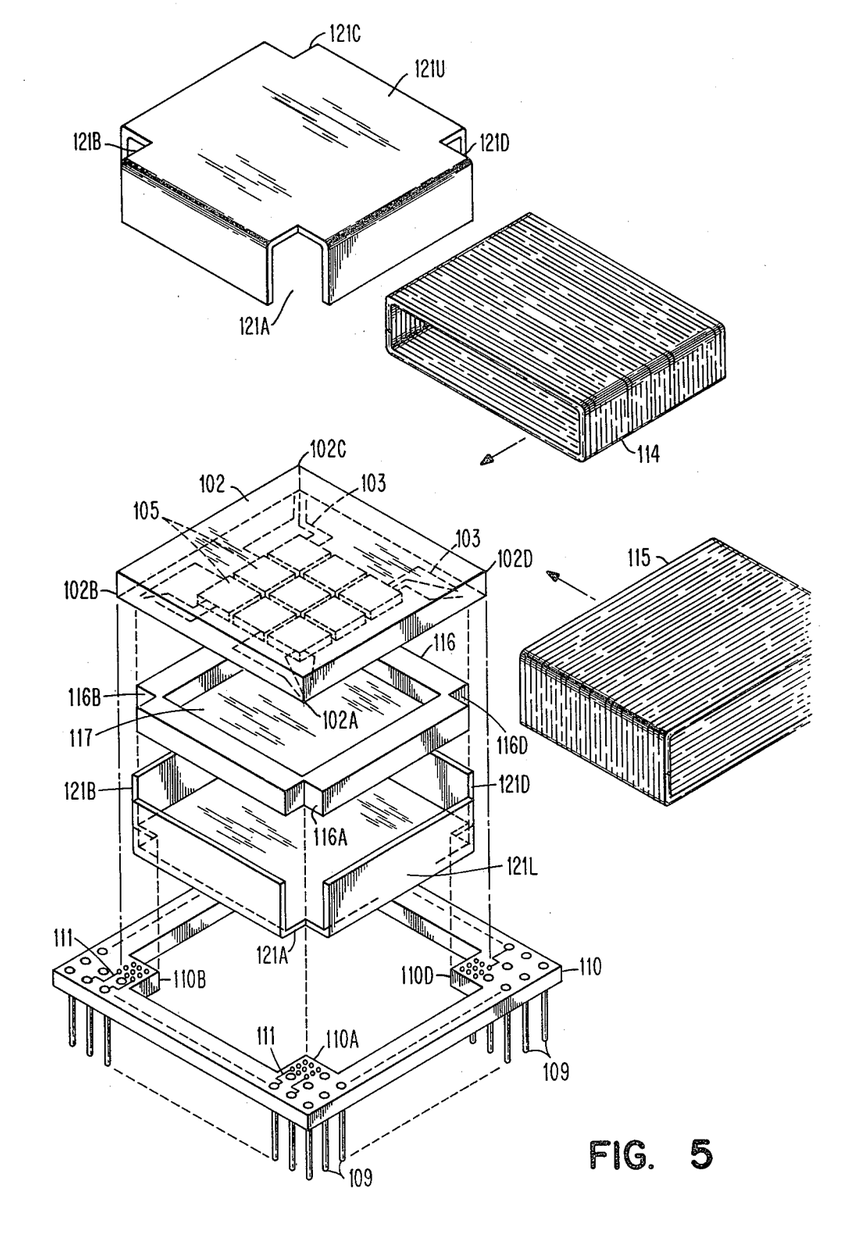
FIG. 5 is a perspective and exploded view of a partial assembly of the apparatus of FIG. 4.

Referring now to FIGS. 4 and 5, in the field-accessed magnetic domain device package apparatus 101 thereof, the permanent magnet ceramic member 102 has plural conductors 103, only a few of which are illustrated for sake of clarity, that are directly affixed to and supported by member 102 on its surface 104. The conductors 103 originate on surface 104 at the four corners 102A-102D of member 102 where they are arranged in a predetermined array. From the four corners 102A-102D, the conductor 103 fan out to the individual domain chip bonding sites of the member 102.

A three-by-three array of magnetic domain devices, cf. chips 105, are superimposedly mounted on and supported by member 102 by selectively bonding the chip I/O terminals, not shown for sake of clarity, on chip surfaces 106 to the conductors 103 at the bonding sites via reflow solder connectors 107, for example. A coverlike insulator spacer member 116 with four corner cutouts 116A–116D coacts with the member 102 to enclose the chips 105 within its recess 117. Inner and outer rotational field coils 114, 115 are orthogonally disposed about the enclosure assembly 102 and 116. Lower and upper high permeability magnetic circuit members 121L and 121U form an enclosure for the field coil enclosed assembly 102 and 116 with the four corners 102A–102D of member 102 protruding from the four corner cutouts 116A–116D and aligned cutouts 121A–121D of members 121U and 121L.

A frame-like pin carrier member 110, preferably ceramic, has conductors 111 affixed to the surface from which the heads of pins 109 protrude. Only a few conductors 111 are shown, for sake of clarity. The conductors 111 are arranged at each of the inner corner segments 110A–110D of member 110 in an array compatible to and in alignment with the arrays of the conductors 103 of member 102 at the respective corresponding corners 102A–102D. Thus, when the assembled members 121U and 121L are fitted into the crosslike opening of the frame member 110, the four surface corners of the surface 104 associated with the four corners 102A–102D of the member 102 are in butting and facing alignment with the respective surfaces of the four segments 110A–110D of member 110. Their respective also aligned conductors 103 and 111 thereat are bonded together thereby coupling the aforementioned I/O device terminals, not shown, of the chips 105 to the I/O package terminals, i.e. pins 109.

Member 102 coacts with the members 121U, 121L to provide a magnetic bias field for the chips 105 in a manner substantially similar to that previously described for the corresponding like elements 2, 21, and 5 of the apparatus 1 of FIGS. 1–3. In a similar manner, shield cover 125 and sealant 126 of the apparatus 101 provides identical respective functions as corresponding like elements 25 and 26, respectively, of apparatus 1 of FIGS. 1–3.

Figure 6:
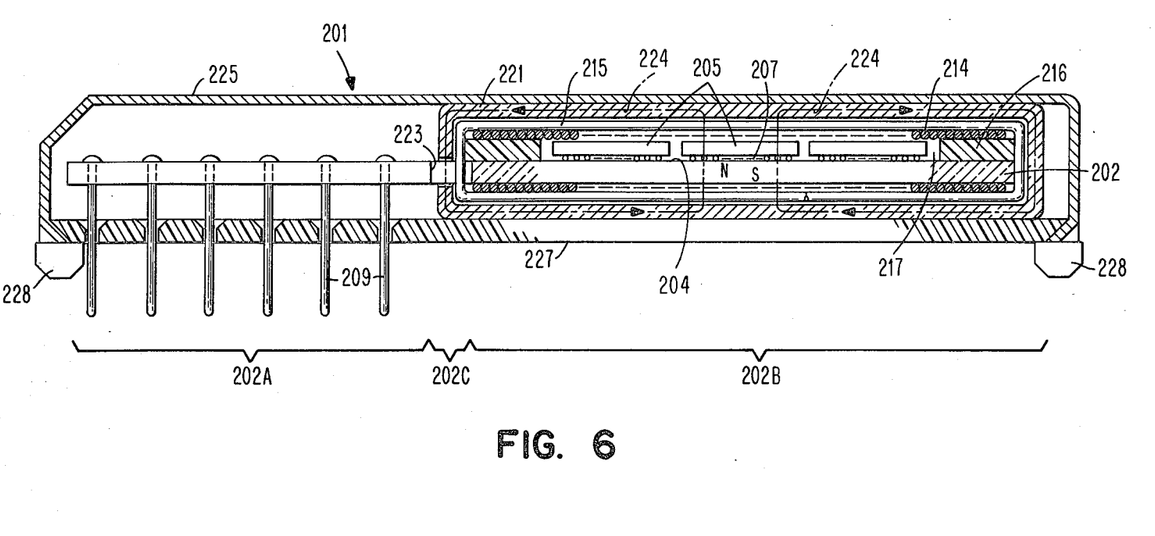
FIG. 6 is a cross-sectional view of still another preferred embodiment of the apparatus of the present invention.
Figure 7:
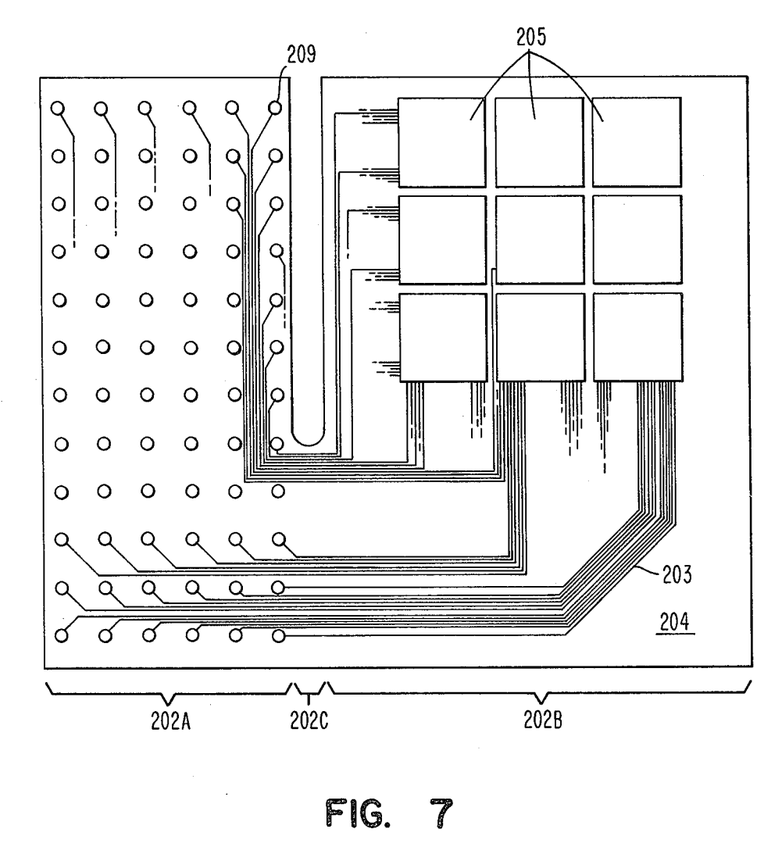
FIG. 7 is a perspective and exploded view of a partial assembly of the apparatus of FIG. 6.

In the field-accessed magnetic domain device package apparatus 201 of FIGS. 6–7, the permanent magnet ceramic insulator member 202 is also used as the carrier for the I/O package terminals, to wit: pins 209. As shown in greater detail on FIG. 7, the conductor pattern 203, only some of which conductors are shown for sake of clarity, is directly affixed to and supported by the member 202 on its surface 204. Conductors 203 are fanned out to individual ones of the slightly protruding heads of the array of pins 209 in the pin carrier portion 202A of member 202. The conductors 203 are also fanned out to the different chip bonding sites of the chip carrying or support portion 202B of member 202. The illustrated three-by-three array of bubble domain chips 205 have I/O terminals, not shown for sake of clarity, on the surfaces 206, FIG. 6, which are selectively bonded to the conductors 203 at the respective chip bonding sites by, for example, solder reflow connectors 207. Thus, conductors 203 directly couple the I/O chip terminals, not shown, to the I/O package terminals 209. The chips 205 are encompassed in a ringlike spacer member 216, about which are disposed the orthogonal inner and outer rotational field coils 214 and 215, respectively. Magnetic circuit member 221 has a hollow sleevelike configuration with a slit 223 for passage therebetween of the bridge segment 202C which integrally links members 202A and 202B of member 202. Member 221 is a high permeability member which is encompassed around outer coil 215. Member 202 in coaction with member 221 provides a magnetic bias field for the chips 205 in a manner substantially similar to that aforedescribed for the corresponding like elements 2 and 21 of the apparatus 1 of FIGS. 1–3. Shield cover 225 coacts with the insulator molded base 227 as an enclosure which hermetically seals with an appropriate sealant, not shown, the aforedescribed assembled elements 202, 205, 214–216, 221 and pins 209, with the exception of the external or protruding parts thereof. To provide mechanical stability for the cantilever like shape of apparatus 201, each corner of the base 227 is provided with a standoff or leg 228.

The apparatus 1, 101, 201 of FIGS. 1–7 do not employ a holding field and are intended for applications where a holding field is not critical and/or required. Thus, the respective magnetic axes of permanent magnet members 2, 102 and 202 of FIGS. 1–3, 4–5 and 6–7, respectively, are substantially normal to the plane of their particular magnetic members 2, 102, 202 and hence the direction of the respective base field flux lines 24, 124 and 224 is substantially normal to the plane of the respective domain devices or chips 5, 105 and 205 in the respective spaces 17, 117 and 217 as the flux passes therethrough and into the respective coacting magnetic circuit members 21, 121L–121U and 221.

To accommodate those applications where a holding field is desirous, the apparatus 1, 101, 201 may be modified to provide a small angular relative tilt, e.g. typically two and one-half degrees, with respect to the aforementioned direction of the flux lines and the normal to the domain devices. Preferably, the desired holding field characteristic is accomplished by including in the bias field magnetic circuit system, another permanent magnet member in the manner hereinafter to be described. As is well known to those skilled in the art, the holding field allows proper restart of the bubbles, if, for example, whenever power to the devices is removed.

Figure 8:
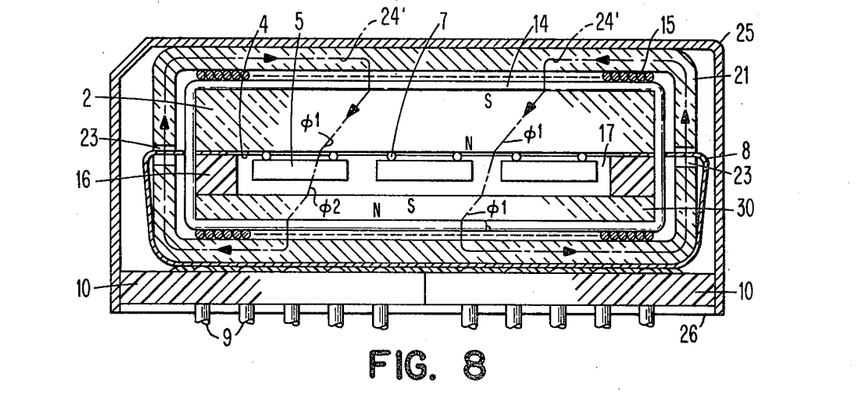
FIGS. 8-10 are cross-sectional views, partially shown of modifications of the embodiments of FIGS, 1, 4 and 6, respectively.

Referring to FIG. 8, the apparatus 1 of FIG. 1 is thus modified to include a planar second permanent magnet member 30 which is juxtaposed on the opposite side of devices 5. Magnet 30 is preferably a ferrite type or alternatively may be a ceramic type similar to member 2. The members 2 and 30 are polarized in magnetic attracting relationship with respect to each other and have respective magnetic axes that are substantially skewed in the same general direction. Preferably the two magnetic axes of members 2 and 30 are skewed at the same, i.e. equal, angle $\phi 1$. As a result, the flux lines 24' emanating from member 2 toward member 30 are tilted at a resultant angle $\phi 2$, and returned to the other surface of member 2 via the magnetic circuit path of members 30 and 21. Preferably, the spacer member 16' is modified to be configured as a ringlike member in lieu of the coverlike member 16 of FIG. 1. The angle $\phi 1$ is judiciously selected to provide the desired resultant tilt angle $\phi 2$. Alternatively, the respective magnetic axis angles of members 2 and 30 may be different, i.e. unequal. However, by judiciously selecting the magnetic axis angles of the members 2 and 30 the desired tilt angle $\phi 2$ may be effected.

Figure 9:
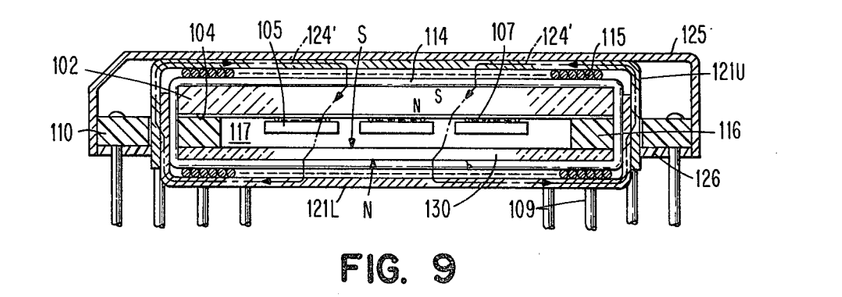
Figure 10:
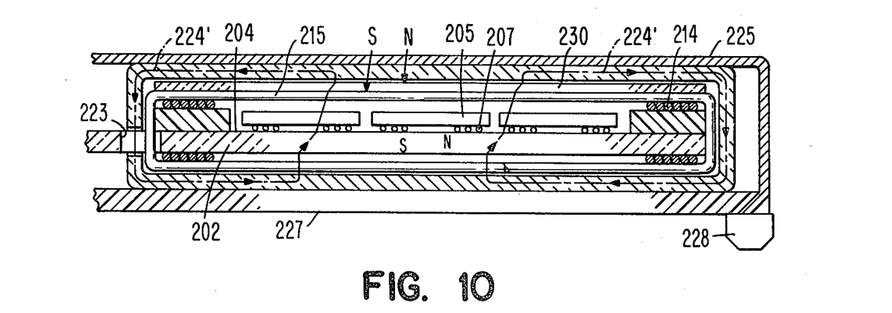

Likewise, the apparatus 101 and 201 of FIGS. 4 and 6 are modified in a similar manner to provide the desired tilt angle to produce the holding field. Thus referring to FIG. 9, the apparatus 101 of FIG. 4 is modified to include a planar second magent 130. The magnets 102 and130 are polarized in attracting relationship and have magnetic axes skewed in the same direction and angle in a manner similar to that described for the corresponding members 2 and 30 of FIG. 8. Similarly, the apparatus 201 of FIG. 6 is modified to include the second permanent magnet 230 as shown in FIG. 10. Again, the magnets 202 and 230 of FIG. 10 are polarized in attracting relationship and have magnetic axes skewed in the same direction and angle in a manner similar to that described for the corresponding members 2 and 30 of FIG. 8.

It should be understood that in practice in the illustrated embodiments, the ends of the coils 14 and 15, coils 114 and 115, and coils 214 and 215 are each connected to respective predetermined ones of the I/O package terminals that are reserved and dedicated exclusively for this purpose. For sake of clarity, however, these connections have been omitted in the figures.

If desired, the invention may be modified to include only one or alternately some plural number other than the nine domain devices used by way of example in describing the preferred embodiments. Also, as is apparent to those skilled in the art, the rotational field coils may be wound as the package apparatus is being assembled instead of being prewound and/or may be other types, such as flat coil types, for example.

Thus, while the invention has been particularly shown and described with reference to preferred embodiments thereof, it will be understood by those skilled in the art that various changes in form and details may be made therein without departing from the spirit and scope of the invention.

We claim:

1. In field-accessed magnetic domain device package apparatus, said apparatus having plural input/output package terminals and a rotational magnetic field coil system associated therewith, the combination comprising:
    magnetic ceramic first member means for providing a magnetic bias field source,
    plural conductors directly affixed to and supported by said first member means,
    at least one magnetic domain device having plural input/output device terminals, said first member means supporting said magnetic domain device in a predetermined superimposed relationship thereto by selectively bonding said input/output device terminals to said plural conductors, said plural conductors being further selectively coupled to said input/output package terminals, magnetic circuit second member means coacting with said first member means to provide a magnetic bias field for said domain device, and
    insulator carrier third member means for carrying said input/output package terminals, said third member means being external to said second member means.

2. Field accessed magnetic domain device package apparatus according to claim 1 further comprising a permanent magnet fourth member means, said first member means coacting with said fourth member means to provide said magnetic bias field with a predetermined holding field characteristic.

3. Field-accessed magnetic domain device package apparatus comprising:
    plural input/output package terminals,
    planar magnetic ceramic first member means for providing a magnetic bias field source,
    plural conductors directly affixed to and supported by said first member means,
    at least one planar magnetic domain device having plural input/output device terminals, said first member means supporting said magnetic domain device in a predetermined superimposed relationship thereto by selectively bonding said input/output device terminals to said plural conductors, said plural conductors being further selectively coupled to said input/output package terminals,
    magnetic circuit second member means coacting with said first member means to provide a magnetic bias field for said domain device,
    a rotational magnetic field coil system for providing a rotational magnetic field for said device, said system having first and second orthogonal coils, said first member means and said device mounted thereon being disposed within said first coil and said second coil being disposed about said first coil in an orthogonally wound relationship, and
    insulator carrier third member means for carrying said input/output package terminals, said third member means being external to said second member means.

4. Field accessed magnetic domain device package apparatus according to claim 3 wherein said magnetic circuit second member means is disposed about said second coil.

5. Field accessed magnetic domain device package apparatus according to claim 3 wherein said third member means has a frame-like configuration disposed about said second member means.

6. Field accessed magnetic domain device package apparatus according to claim 3 wherein said third member means is an integral extension of said first member means, said extension extending outwardly from said second member means.

7. Field accessed magnetic domain device package apparatus of the pluggable type, said apparatus comprising:
    plural input/output package terminal pins,
    planar magnetic ceramic first member means for providing a magnetic bias field source,
    plural conductors directly affixed to and supported by said first member means,
    plural planar magnetic domain devices, each of said devices having plural input/output device terminals, said first member means supporting said magnetic domain devices in a predetermined superimposed relationship thereto by selectively bonding said input/output device terminals to said plural conductors, said plural conductors being further selectively coupled to said input/output package terminal pins,
    a rotational magnetic field coil system for providing a rotational magnetic field for said devices, said system having first and second orthogonal coils, said first member means and said devices mounted thereon being disposed within said first coil and said second coil being disposed about said first coil in an orthogonally wound relationship,
    magnetic circuit second member means disposed about said second coil, said magnetic circuit second member means coacting with said first member means to provide a magnetic bias field for said domain device, and insulator carrier third member means for carrying said input/output package terminal pins, said third member means being external to said second member means.

8. Field accessed magnetic domain device package apparatus according to claim 7 wherein said third member means has a frame-like configuration disposed about said second member means.

9. Field accessed magnetic domain device package apparatus according to claim 7 wherein said third member means is an integral extension of said first member means, said extension extending outwardly from said second member means.

10. Field accessed magnetic domain device package apparatus according to claim 7 further comprising a permanent magnet fourth member means, said first member means coacting with said fourth member means to provide said magnetic bias field with a predetermined holding field characteristic.

11. A magnetic bubble memory package comprising:
- a plurality of electrical input/output terminals,
- at least one magnetic bubble memory chip,
- a magnetic field coil system for providing a moving magnetic field through said chip,
- a magnetic circuit member, a substrate for physically supporting said chip, said substrate being formed of nonconducting magnetic ceramic material which in co-action with said magnetic circuit member provides a bias field through said chip,
- a plurality of conductors on said substrate,
- electrical connections between said chip and said conductors, and between said conductors and said terminals,
- whereby said substrate provides a physical support for said chip, a source of magnetic bias field for said chip, and direct physical support for said terminals and said conductors connecting the chip to said terminals, said terminals being supported by said substrate external to said magnetic circuit member.

* * * * *